United States Patent [19]
O'Brien

[11] Patent Number: 5,550,840
[45] Date of Patent: Aug. 27, 1996

[54] NOISE SUPPRESSION IN LARGE THREE STATE BUSSES DURING TEST

[75] Inventor: Mark O'Brien, San Jose, Calif.

[73] Assignee: LSI Logic Corporation, Milpitas, Calif.

[21] Appl. No.: 180,730

[22] Filed: Jan. 12, 1994

[51] Int. Cl.$^6$ .................................................. H04B 15/00
[52] U.S. Cl. ........................... 371/22.1; 364/574; 371/27; 371/28
[58] Field of Search ..................... 364/574, 490; 326/26, 21, 23; 371/22.1, 27, 28; 307/520, 443; 324/527, 537, 613

[56] References Cited

U.S. PATENT DOCUMENTS

| | | | |
|---|---|---|---|
| 3,774,053 | 11/1973 | Carlson | 326/23 |
| 4,857,765 | 8/1989 | Cahill et al. | 326/26 |
| 5,119,321 | 6/1992 | Burton, Jr. et al. | 364/574 |
| 5,149,990 | 9/1992 | Yamazaki et al. | 326/21 |
| 5,265,038 | 11/1993 | Kwok | 364/574 |
| 5,311,453 | 5/1994 | Denenberg et al. | 364/574 |
| 5,386,393 | 1/1995 | Hallee et al. | 364/574 |

*Primary Examiner*—Emanuel T. Voeltz
*Assistant Examiner*—Thomas Peeso
*Attorney, Agent, or Firm*—Poms, Smith, Lande & Rose

[57] ABSTRACT

A method for suppressing noise encountered during testing of large semiconductor chips is disclosed herein. Output drivers on the semiconductor chip may occasionally produce errant signals during testing, and such errant signals may be coupled through ground or nearby pins which are asynchronous edge sensitive pins to produce false internal transitions. The false internal transitions can cause the chip to fail the test. The proposed method suppresses the noise by disabling the output drivers during portions of the test which may induce errant signals and enables the output drivers when such potentially errant signals have passed.

8 Claims, 1 Drawing Sheet

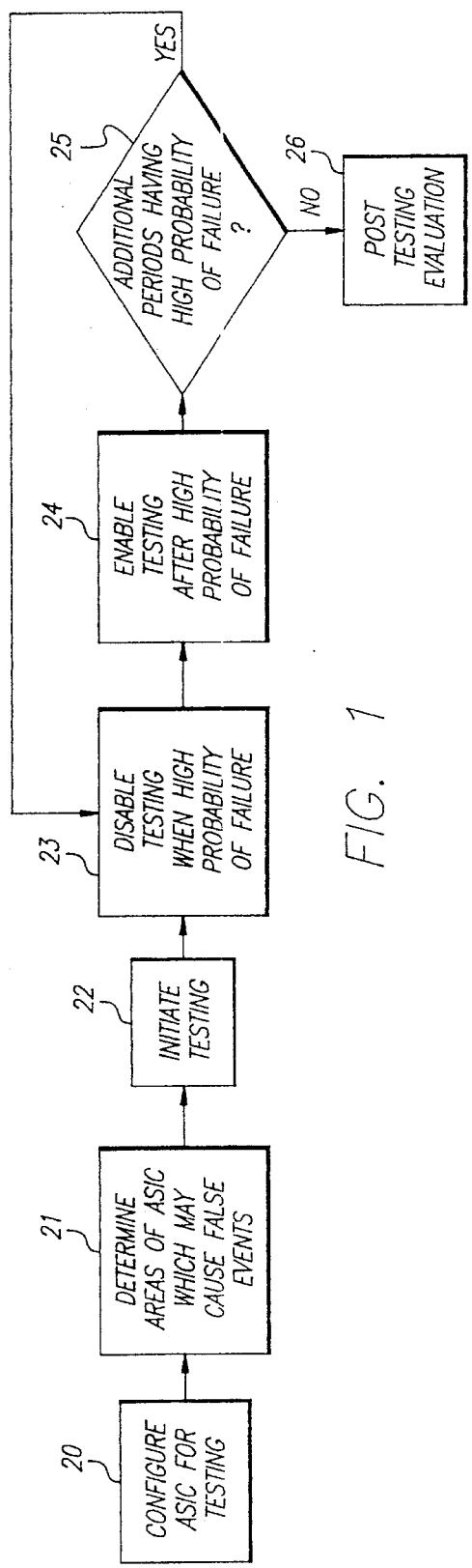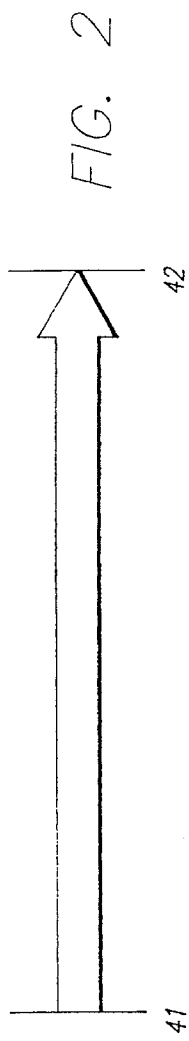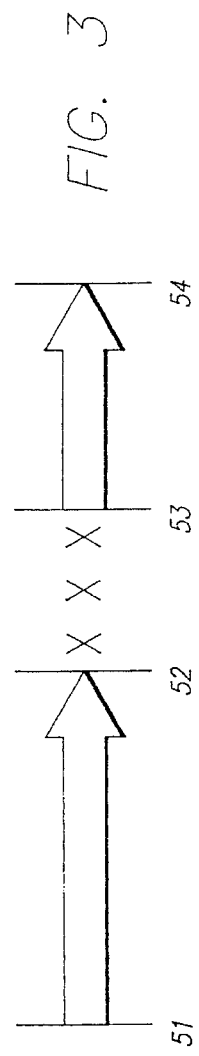

5,550,840

NOISE SUPPRESSION IN LARGE THREE STATE BUSSES DURING TEST

FIELD OF THE INVENTION

This invention relates to noise suppression during testing of semiconductor devices, and more specifically to suppressing noise during testing of large ASICs (application specific integrated circuits) by disabling three state bus outputs from the circuit during test.

BACKGROUND OF THE INVENTION

Users of ASICs frequently specify a design implementation which is carried out by the ASIC manufacturer. During testing of these chips by the manufacturer, increasing current levels may be applied to the chip. If sections of the chip have been programmed with a high density of current drivers, the use of increased current levels during testing may cause a glitching phenomenon, or noise, before the individual flip-flops transition to the desired state.

This glitching or noise may be coupled through ground pins or other pins on the chip and result in noise on those nearby pins. As testing of the system is accomplished by monitoring output pins based on various inputs, the noise internal to the chip may cause the ASIC to fail the test pattern or barely pass testing, indicating an internal problem when none actually exists, that is, where the observed phenomenon is merely a result of the design of the ASIC.

Previous attempts to solve this problem have been to either (1) attempt to redesign the entire chip to reduce the density of current drivers in sections of the chip, (2) alter the test vectors used during the test to exercise portions of the chip so as to avoid false transitions, or (3) test the chip on a more sophisticated and more expensive testing device, requiring more test time and man hours and lowering the number of ASICs produced in a fixed period of time.

Accordingly, a principal object of the present invention is to provide a testing method which can be performed quickly on a relatively inexpensive test station and which minimizes the effects of noise internal to the ASIC without redesigning the entire ASIC. Such a method should minimize the number of false test failure indications at a low cost in dollars and man hours.

A further object of this invention is to provide a low-cost test environment which can be used for all ASIC designs, not only those designs having no false test indications during testing.

SUMMARY OF THE INVENTION

According to the present invention, a method for suppressing noise during testing of large ASICs is provided which includes determining which portions of an ASIC could cause false internal transitions, such as asynchronous edge sensitive pins, ground pins, or portions of the chip having relatively high current densities or current flow paths through high inductances, isolating a potentially noisy portion of testing where a high incidence of false transitions between states may occur, testing the chip while disabling the output drivers of the chip during the noisy portion of testing, and enabling the output drivers after the noisy portion of said testing has been completed. The enabling/disabling feature of the invention may be repeated depending on the portions of the chip giving rise to potential false transitions and the sequence of testing the integrity of the chip.

Other objects, features, and advantages of the present invention will become more apparent from a consideration of the following detailed description and from the accompanying drawings.

DESCRIPTION OF THE DRAWINGS

FIG. 1 is a block diagram of the one embodiment of the present invention for suppressing noise and successfully testing an ASIC.

FIG. 2 shows testing without noise suppression.

FIG. 3 shows testing with noise suppression.

DESCRIPTION OF THE PREFERRED EMBODIMENT

FIG. 1 illustrates one method of the present invention in block diagram form, including configuration step 20 which prepares the chip for proper testing. Configuration step 20 consists of designing the chip so that three state output drivers are physically located on the chip. Three state drivers are well known in the industry to provide a controllable inverter, and configuration step 20 provides for testing of the chip with controllable output ability through these three state drivers. Configuration step 20 thus provides a master control signal on the chip for controlling data output from pins on the chip. Testing using this control ability can be performed on a test board using a minimal number of input test vectors. Failure to utilize configuration step 20 results in output monitoring from a limited set of locations on the chip, requiring more test vectors to be run for a longer period of time to verify integrity of the design. Specific drivers on the chip can therefore be enabled or disabled once configuration step 20 is implemented.

Determination step 21 consists of locating areas of the chip which could potentially cause false events, or transitions, on the chip. Since changes typically occur as a result of current rate changes, determination step 21 involves the identification of areas on the chip having large inductance, and areas sensitive to high changes in current rate. For large chips, voltage increases over 1.5 volts on a single pin can cause false internal transitions. Internal design of the circuitry may indicate areas having an undesirably high density of current drivers, and initial running of test vectors through the circuit may be required to assess these potentially troublesome areas during determination step 21. Determination step 21 requires observing the voltage on the output drivers and pins associated therewith. High voltages indicate areas particularly sensitive to changes in current and indicate potential problems during testing. Determination step 21 requires assessing whether pins are asynchronous or edge sensitive, such as pins having clock signals, as these pins are particularly sensitive to small noise fluctuations. Noise occurring on these pins will normally generate failure signals for the chip due to the varying currents.

Once determination step 21 has assessed the performance of the chip, testing is initiated on the chip by running predetermined test vectors through the chip in testing initiation step 22. Disable step 23 disables those portions of a test vector found to have high probabilities of producing an event which may cause a failure signal in the determination step 21. If the test segment is testing those areas having an undesirably high density of current drivers or a substantial likelihood of noise within the system, outputs during those test segments are suppressed during disable step 23.

After portions of a test vector having a high probability of generating false transitions have expired in a single test vector, output drivers may then be re-energized in enabling step 24. Enabling step 24 thus permits the output drivers to operate and testing of the chip can be completed. Utilizing disable step 23 and enable step 24 permits running the test vectors initially designed for the chip and thus does not require additional effort to create new test vectors.

Evaluation step 25 checks whether additional portions of the chip having architecture which could cause false internal transitions from determination step 21 are to be assessed during subsequent portions of the test. If subsequent test vectors are to exercise separate portions of the ASICs then disable step 23 may be repeated, and followed again by enable step 24 once the test vectors have run. If no further sensitive areas of the chip are to be tested, then the test is completed and the outputs from the areas evaluated.

Post-testing evaluation step 26 determines whether additional testing is required on a more expensive testing setup or whether test vectors or ASIC architecture must be altered to complete test of the ASIC. If no further testing is required within post-testing evaluation step 26, the chip passes the test.

FIG. 2 and FIG. 3 illustrate the timing of the noise suppression during testing. FIG. 2 is the timing of testing, where initiation point 41 is commencement of transmitting test vectors to the chip, and completion point 42 is the end of the test. FIG. 3 is the timing of testing with noise suppression, with revised initiation point 51 the beginning of testing, disablement point 52 the point at which signals are blocked, or suppressed, from being output from the three state drivers on the ASIC. Enablement point 53 is the point at which the system may subsequently be tested without the threat of false transitions occurring. Revised completion point 54 is the point at which all test vectors have been run through the system and testing is complete.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A method for suppressing noise during testing of a semiconductor chip having a plurality of output drivers, comprising the steps of:
   applying a master control signal to the semiconductor chip for controlling data output therefrom;
   identifying areas on the semiconductor chip where spurious transitions could occur by measuring inductance and by measuring sensitivity to changes in the master control signal;
   isolating a noisy portion of the semiconductor chip where spurious transitions between states may occur by running a test vector through the semiconductor chip and disabling portions of the test vector that could produce a failure signal in the identified areas where spurious transitions could occur;
   testing the semiconductor chip;
   disabling output drivers in the noisy portion of said semiconductor chip;
   enabling the output drivers in the noisy portion of said semiconductor chip after portions of the test vector that could cause spurious transitions have expired; and
   completing testing of the semiconductor chip by running portions of the test vector that remain after the portions of the test vector that could cause spurious transitions have expired.

2. The method for suppressing noise during testing of a semiconductor chip having a plurality of output drivers of claim 1, further comprising the step of determining asynchronous edge sensitive pins on the semiconductor chip where spurious internal transitions may occur prior to said isolating step.

3. The method for suppressing noise during testing of a semiconductor chip having a plurality of output drivers of claim 2, further comprising the step of repeating the disabling and enabling steps until testing is complete.

4. The method for suppressing noise during testing of a semiconductor chip having a plurality of output drivers of claim 3, wherein the isolating step further comprises determining ground pins and large blocks of output drivers having high inductance and creating spurious transitions between states when increased current is applied to the chip.

5. A method for suppressing noise during testing of a semiconductor chip having a plurality of three state output drivers, comprising the steps of:
   determining asynchronous edge sensitive pins on the semiconductor chip where spurious internal transitions may occur;
   isolating a noisy portion of the semiconductor chip where a high incidence of edge sensitive pins exist and spurious transitions between states may occur by running a test vector through the semiconductor chip and disabling portions of the test vector that could produce a failure signal in the identified areas where spurious transitions could occur;
   testing the semiconductor chip;
   blocking noise from exiting the chip through output drivers in the noisy portion of the semiconductor chip during testing of the noisy portion of said semiconductor chip; and
   enabling the plurality of output drivers after the noisy portion of said semiconductor chip has been tested.

6. The method for suppressing noise during testing of a semiconductor chip having a plurality of output drivers of claim 5, further comprising the step of repeating the blocking and enabling steps until testing is complete.

7. The method for suppressing noise during testing of a semiconductor chip having a plurality of output drivers of claim 5, wherein the isolating step further comprises determining ground pins and large blocks of output drivers having high inductance and creating spurious transitions between states when increased current is applied to the chip.

8. A method for suppressing noise during testing of a semiconductor chip having a plurality of three state output drivers, comprising:
   determining which of the plurality of three state output drivers have large inductance;
   running a test vector through the semiconductor chip and disabling portions of the test vector that could produce a failure signal in the identified areas where spurious transitions could occur to isolate asynchronous edge sensitive pins on said semiconductor chip;
   initiating testing of said semiconductor chip;
   disabling large inductance output drivers and asynchronous edge sensitive pins during testing which may induce spurious transitions between states;
   enabling large inductance output drivers and asynchronous edge sensitive pins when voltage high enough to create spurious transitions to alternate states no longer exists; and
   repeating said disabling and enabling steps until testing is completed.

* * * * *